(12) United States Patent
Sekiguchi et al.

(10) Patent No.: US 7,806,989 B2
(45) Date of Patent: Oct. 5, 2010

(54) SUBSTRATE PROCESSING METHOD AND SUBSTRATE PROCESSING APPARATUS

(75) Inventors: Kenji Sekiguchi, Nirasaki (JP); Noritaka Uchida, Koshi (JP); Satoru Tanaka, Koshi (JP); Hiroki Ohno, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1052 days.

(21) Appl. No.: 11/394,337

(22) Filed: Mar. 31, 2006

(65) Prior Publication Data

US 2007/0017555 A1   Jan. 25, 2007

(30) Foreign Application Priority Data

Jun. 23, 2005 (JP) ............................ 2005-183549
Dec. 28, 2005 (JP) ............................ 2005-380090

(51) Int. Cl.
*B08B 3/00* (2006.01)
*B08B 7/04* (2006.01)

(52) U.S. Cl. ............................ 134/30; 134/26; 134/33; 134/36; 134/37; 134/902

(58) Field of Classification Search ............. 134/26, 134/30, 31, 32, 33, 36, 37, 902
See application file for complete search history.

(56) References Cited

U.S. PATENT DOCUMENTS

| | | | |
|---|---|---|---|
| 5,882,433 A * | 3/1999 | Ueno | 134/31 |
| 5,882,466 A | 3/1999 | Grootaert et al. | |
| 6,004,047 A | 12/1999 | Akimoto et al. | |
| 6,092,937 A * | 7/2000 | Snodgrass et al. | 396/611 |
| 6,247,479 B1 | 6/2001 | Taniyama et al. | |
| 6,333,275 B1 | 12/2001 | Mayer et al. | |
| 6,491,764 B2 * | 12/2002 | Mertens et al. | 134/36 |

(Continued)

FOREIGN PATENT DOCUMENTS

JP   02-046728   2/1990

(Continued)

OTHER PUBLICATIONS

Japanese Office Action issued on Jan. 19, 2010 for Japanese Patent Application No. 2005-380090 with English translation.

(Continued)

*Primary Examiner*—Alexander Markoff
(74) *Attorney, Agent, or Firm*—Smith, Gambrell & Russell, LLP

(57) ABSTRACT

A substrate (W) is processed with the use of a process liquid such as a deionized water. Then, a first fluid which is more volatile than the process liquid is supplied to an upper surface of the substrate (W) from a fluid nozzle (12) to form a liquid film. Next, a second fluid which is more volatile than the process liquid is supplied to the upper surface of the substrate (W) from the fluid nozzle (12), while the wafer (W) is being rotated. During this supply operation, a supply position (Sf) of the second fluid to the substrate (W) is moved radially outward from a rotational center (Po) of the substrate (W). As a result, it is possible to prevent the generation of particles on the substrate (W) after it is dried by using the first and second fluids.

28 Claims, 9 Drawing Sheets

U.S. PATENT DOCUMENTS

| | | | |
|---|---|---|---|
| 6,834,440 B2 * | 12/2004 | Lee .............................. | 34/58 |
| 6,863,741 B2 * | 3/2005 | Orii et al. .................... | 134/30 |
| 7,543,593 B2 | 6/2009 | Orii et al. | |
| 2001/0004878 A1 | 6/2001 | Sakai et al. | |
| 2002/0007844 A1 | 1/2002 | Orii et al. | |
| 2007/0017555 A1 | 1/2007 | Sekiguchi et al. | |
| 2007/0131256 A1 | 6/2007 | Nanba et al. | |
| 2007/0223342 A1 | 9/2007 | Orii et al. | |
| 2008/0093340 A1 | 4/2008 | Nakamori et al. | |

FOREIGN PATENT DOCUMENTS

| | | |
|---|---|---|
| JP | 04-179227 | 6/1992 |
| JP | 6-9130 | 2/1994 |
| JP | 09-038595 | 2/1997 |
| JP | 09-069488 | 3/1997 |
| JP | 9-293702 | 11/1997 |
| JP | 11-233481 | 8/1999 |
| JP | 2000-058498 | 2/2000 |
| JP | 2001-053051 | 2/2001 |
| JP | 2002-057088 | 2/2002 |
| JP | 2002-110612 | 4/2002 |
| JP | 2003-197590 | 7/2003 |
| JP | 2003-229404 | 8/2003 |
| JP | 2005-159191 | 6/2005 |
| WO | 03/007348 | 11/2003 |
| WO | 2005/050724 | 6/2005 |

OTHER PUBLICATIONS

Notification of Transmittal of Translation of the International Preliminary Report on Patentability (Form PCT/IB/338) in connection with PCT/JP2005/018770, dated Jan. 2004.
International Preliminary Report on Patentability (Form PCT/IB/373) in connection with PCT/JP2005/018770, dated Jan. 2004.
Translation of Written Opinion (Form PCT/ISA/237) in connection with PCT/JP2005/018770, dated Jan. 2004.
PCT Second and Supplementary Notice Informing the Applicant of the Communication of the International Application (Form PCT/IB/308) (Second and Supplementary Notice) in connection with PCT/JP2005/018770, dated Jan. 2004.
Notification of Reasons for Rejection issued on Jan. 23, 2009.
Supplementary European Search Report for Application No. EP 05 79 3595 issued Jul. 14, 2009.
Machine Generated Translation of JP 2002-057088, published Feb. 22, 2002.
PCT Notification of Transmittal of Translation of the International Preliminary Examination Report (Form PCT/IB/338) dated Jan. 2004.
PCT International Preliminary Report on Patentability (Form PCT/IB/373) dated Jan. 2004.
PCT Written Opinion of the International Searching Authority (Form/ISA/237) dated Apr. 2005.
Japanese Office Action issued on May 14, 2009 for Japanese Patent Application No. 2005-283390 with English translation.
International Search Report ( PCT/ISA/210).

* cited by examiner

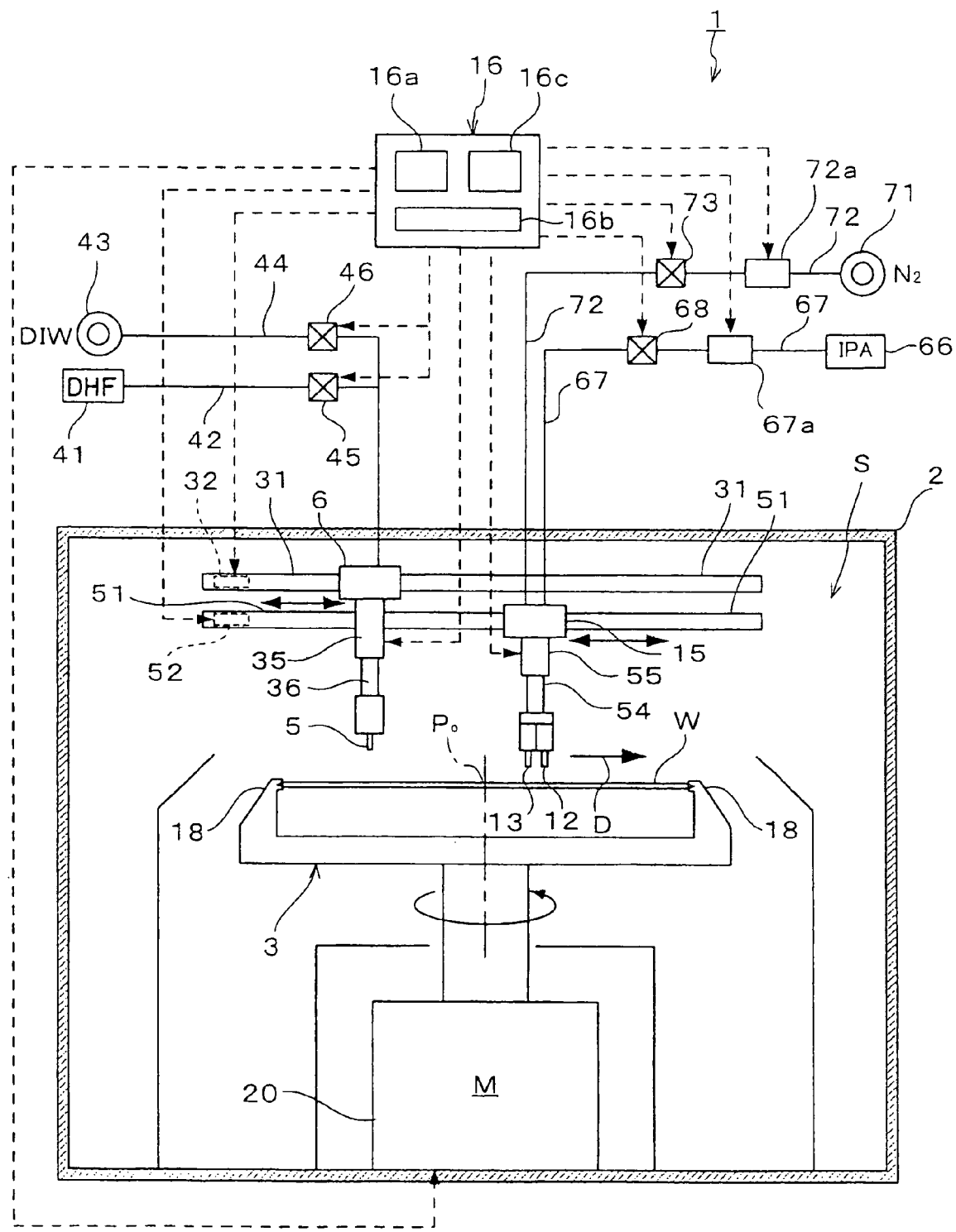
F I G. 7

SUBSTRATE PROCESSING METHOD AND SUBSTRATE PROCESSING APPARATUS

BACKGROUND OF THE INVENTION

1. Field of the Invention

The present invention relates to a substrate processing method for cleaning substrates such as semiconductor wafers and then drying the substrates, and a substrate processing method therefor.

2. Background Art

When manufacturing a semiconductor device, a processing apparatus is used for cleaning, with the use of a chemical liquid, a semiconductor wafer (referred to as "wafer" below) held on a spin chuck. In a cleaning process performed by such an apparatus, a process liquid such as a deionized water is supplied to a wafer, and thereafter the wafer is rotated to remove liquid droplets therefrom due to the centrifugal force so as to dry the wafer.

Conventional methods for drying a wafer include methods for spraying a rotating wafer with an IPA (isopropyl alcohol) vapor, spraying a rotating wafer with atomized IPA, and supplying an IPA liquid to a rotating wafer. Another method for drying a wafer is, while supplying a deionized water to a wafer from a nozzle that radially moves outward from a rotational center of the wafer, to supply an IPA vapor or the like to the wafer at a position nearer to the rotational center than a position at which the deionized water is supplied (JP 11-233481A, and JP 2003-197590A).

However, when a wafer has a high hydrophobic property, the conventional processing method is disadvantageous in that particles generate on a surface of the wafer after it is subjected to a drying process. In particular, when a wafer has a larger diameter, it is difficult to restrain particles (such as stripe water marks generated by a precipitation of a chemical liquid or the like) from appearing near a peripheral portion of the wafer. A possible method for preventing the generation of such particles is to increase a supply amount of a drying fluid such as IPA. However, a larger cost is required for the fluid.

SUMMARY OF THE INVENTION

The object of the present invention is to provide a substrate processing method and a substrate processing apparatus capable of preventing the generation of particles on a substrate after it is dried, while decreasing the amount of fluid used for drying the substrate.

In order to achieve the above-described object, the present invention provides a substrate processing method comprising the steps of:

processing the substrate by a process liquid;

forming a liquid film on an upper surface of the substrate by supplying thereon a first fluid having a higher volatility than that of the process liquid; and supplying a second fluid having a higher volatility than that of the process liquid to the upper surface of the substrate, while rotating the substrate; wherein at the step of supplying the second fluid, a supply position of the second fluid to the substrate is moved radially outward relative to a rotational center of the substrate.

The substrate processing method may further comprise a chemical process step of processing the substrate by a chemical liquid, before the step of processing the substrate by the process liquid.

At the step of forming the liquid film, while rotating the substrate, a supply position of the first fluid to the substrate may be moved radially outward relative to the rotational center of the substrate to form the liquid film.

At the step of supplying the second fluid, a drying gas may be further supplied to the upper surface of the substrate, and supply positions of the drying gas and the second fluid to the substrate may be moved radially outward relative to the rotational center of the wafer, respectively, while maintaining the supply position of the drying gas to the substrate nearer to the rotational center of the substrate than the supply position of the second fluid.

The step of supplying the second fluid may be performed, while sucking an atmosphere near the upper surface of the substrate.

At least one of the step of forming the liquid film and the step of supplying the second fluid may be performed, with a humidity around the substrate being lower than that at the step of processing the substrate by the process liquid.

In addition, the present invention provides a storage medium for storing a program executable by a controller of a substrate processing apparatus, to execute a substrate processing method comprising the steps of:

processing the substrate by a process liquid;

forming a liquid film on an upper surface of the substrate by supplying thereon a first fluid having a higher volatility than that of the process liquid; and supplying a second fluid having a higher volatility than that of the process liquid to the upper surface of the substrate, while rotating the substrate; wherein at the step of supplying the second fluid, a supply position of the second fluid to the substrate is moved radially outward relative to a rotational center of the substrate.

Moreover, the present invention provides a substrate processing apparatus comprising:

(a) a spin chuck configured to hold a substrate and rotate the same;

(b) a process liquid supply system configured to supply a process liquid to an upper surface of the substrate held by the spin chuck;

(c) a first fluid supply system having a first fluid nozzle, configured to supply, from the first fluid nozzle to the upper surface of the substrate, a first fluid having a higher volatility than that of the process liquid;

(d) a second fluid supply system having a second fluid nozzle, configured to supply, from the second fluid nozzle to the upper surface of the substrate, a second fluid having a higher volatility than that of the process liquid;

(e) a nozzle moving mechanism configured to move radially outward the second fluid nozzle relative to a rotational center of the substrate; and (f) a controller configured to control the spin chuck, the process liquid supply system, the first fluid supply system, the second fluid supply system, and the nozzle moving mechanism, to execute the steps of:

supplying the process liquid from the supply system to the upper surface of the substrate;

supplying the first fluid from the first fluid nozzle to the upper surface of the substrate; and supplying the second fluid from the second fluid nozzle to the upper surface of the substrate, while rotating the substrate by the spin chuck and moving the second fluid nozzle by the nozzle moving mechanism.

The substrate processing apparatus may further comprise a drying gas nozzle configured to supply a drying gas to the upper surface of the substrate; wherein the nozzle moving mechanism is configured to move radially outward the drying gas nozzle and the second fluid nozzle relative to the rotational center of the substrate, while maintaining the drying gas nozzle nearer to the rotational center of the substrate than the second fluid nozzle.

The substrate processing apparatus may further comprise a suction nozzle configured to suck an atmosphere near the upper surface of the substrate, wherein the nozzle moving mechanism is configured to move radially outward the suction nozzle and the second fluid nozzle relative to the rotational center of the substrate, while maintaining the suction nozzle farther away from the rotational center of the substrate than the second fluid nozzle.

The substrate processing apparatus may further comprise a humidity adjusting system configured to adjust a humidity around the substrate held by the spin chuck.

For example, the drying gas is an inert gas or a dry air. For example, the processing liquid is a rising liquid, such as a deionized water. For example, at least one of the first liquid and the second liquid is selected from the group consisting of an IPA liquid, an IPA solution, a mist of IPA liquid, an IPA vapor, and a vapor of IPA solution. That is, the "fluid having a higher volatility than that of the process liquid" in the present invention is a concept including a liquid having a higher volatility than that of the process liquid, and a vapor of such liquid.

According to the present invention, a first fluid having a higher volatility than that of a process liquid is supplied to an upper surface of a substrate to form thereon a liquid film, at first. Then, a second fluid having a higher volatility than that of the process liquid is supplied to the upper surface of the substrate, while the substrate is being rotated. During this supply operation, a supply position of the second fluid is moved radially outward relative to a rotational center of the substrate. Due to this, it is possible to prevent the generation of particles on the substrate after it is dried by using the first and second fluids.

When the second fluid is supplied, a drying gas is supplied to the upper surface of the substrate, and a supply position of the drying gas and the supply position of the second fluid are moved radially outward relative to the rotational center of the substrate, while maintaining the supply position of the drying gas to the substrate nearer to the rotational center of the substrate than the supply position of the second fluid to the substrate. Since the use of the drying gas promotes drying of the substrate, an amount of the second fluid used for drying the substrate can be relatively reduced.

BRIEF DESCRIPTION OF THE DRAWINGS

FIG. 7 is a schematic view of another embodiment of the substrate processing apparatus according to the present invention, that is provided with a fluid heater and a drying gas heater;

DETAILED DESCRIPTION OF THE INVENTION

Preferred embodiments of the present invention will be described below, based on a substrate processing apparatus for cleaning an upper surface of a substantially disk-shaped silicon wafer W as a substrate.

Figure 1:
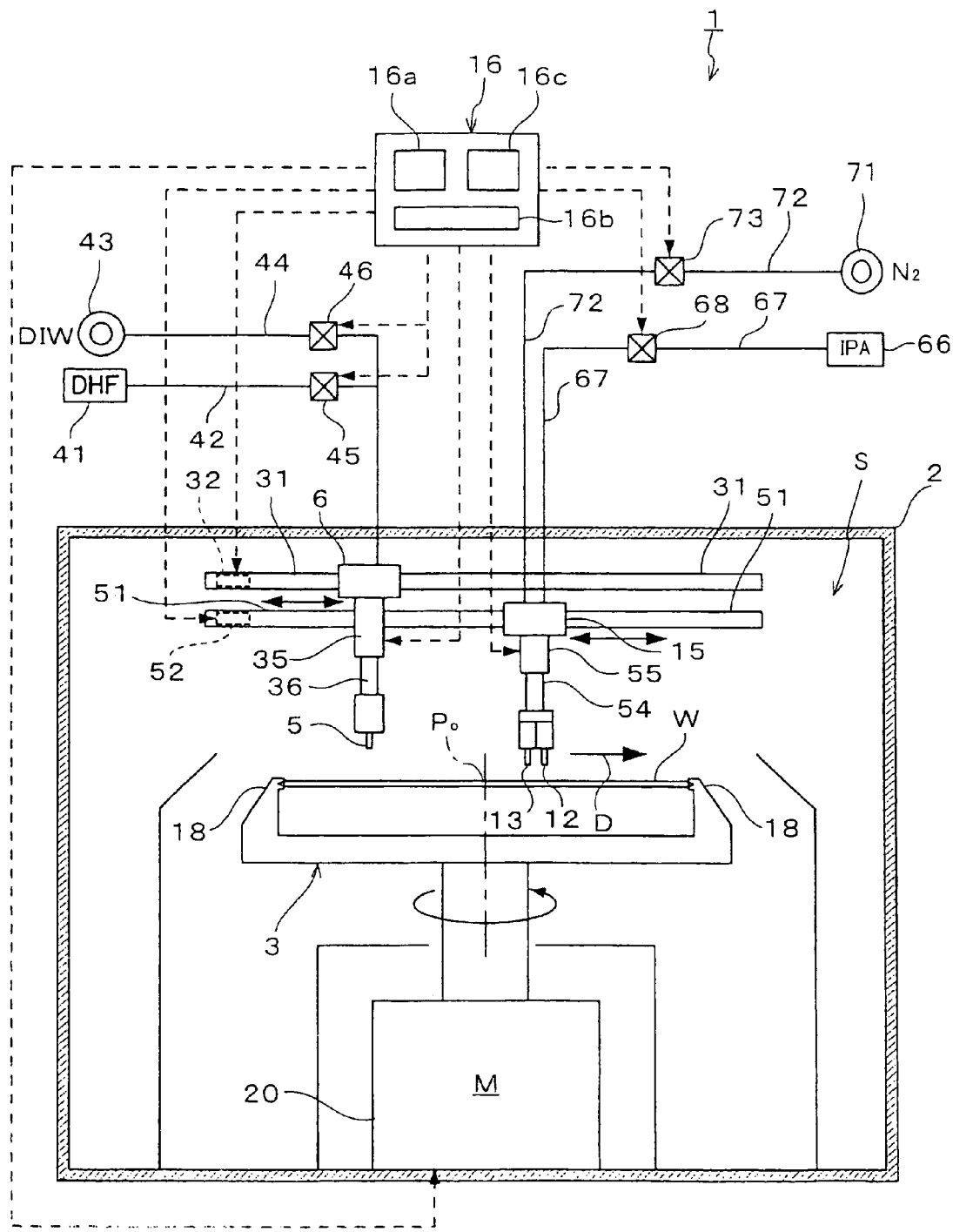
FIG. 1 is a schematic view of one embodiment of a substrate processing apparatus according to the present invention.

As shown in FIG. 1, a substrate processing apparatus 1 in this embodiment includes a process vessel 2 in which a spin chuck 3 is disposed to substantially horizontally hold the wafer W and rotate the same. A liquid nozzle 5 is disposed for supplying to the wafer W a cleaning chemical liquid, such as DHF (dilute hydrofluoric acid), and a rinse liquid such as a deionized water (DIW). The liquid nozzle 5 is supported by a first support arm 6. A fluid nozzle 12 is disposed to supply, as a first fluid and a second fluid, a fluid having a higher volatility than that of a deionized water as a rinse liquid, such as an IPA (isopropyl alcohol) liquid. A drying gas nozzle 13 is disposed to supply, as a drying gas, an inert gas such as nitrogen gas ($N_2$ gas). The fluid nozzle 12 and the drying gas nozzle 13 are supported by a second support arm 15. A controller 16 including a CPU is disposed to control the respective elements of the substrate processing apparatus 1.

Figure 2:
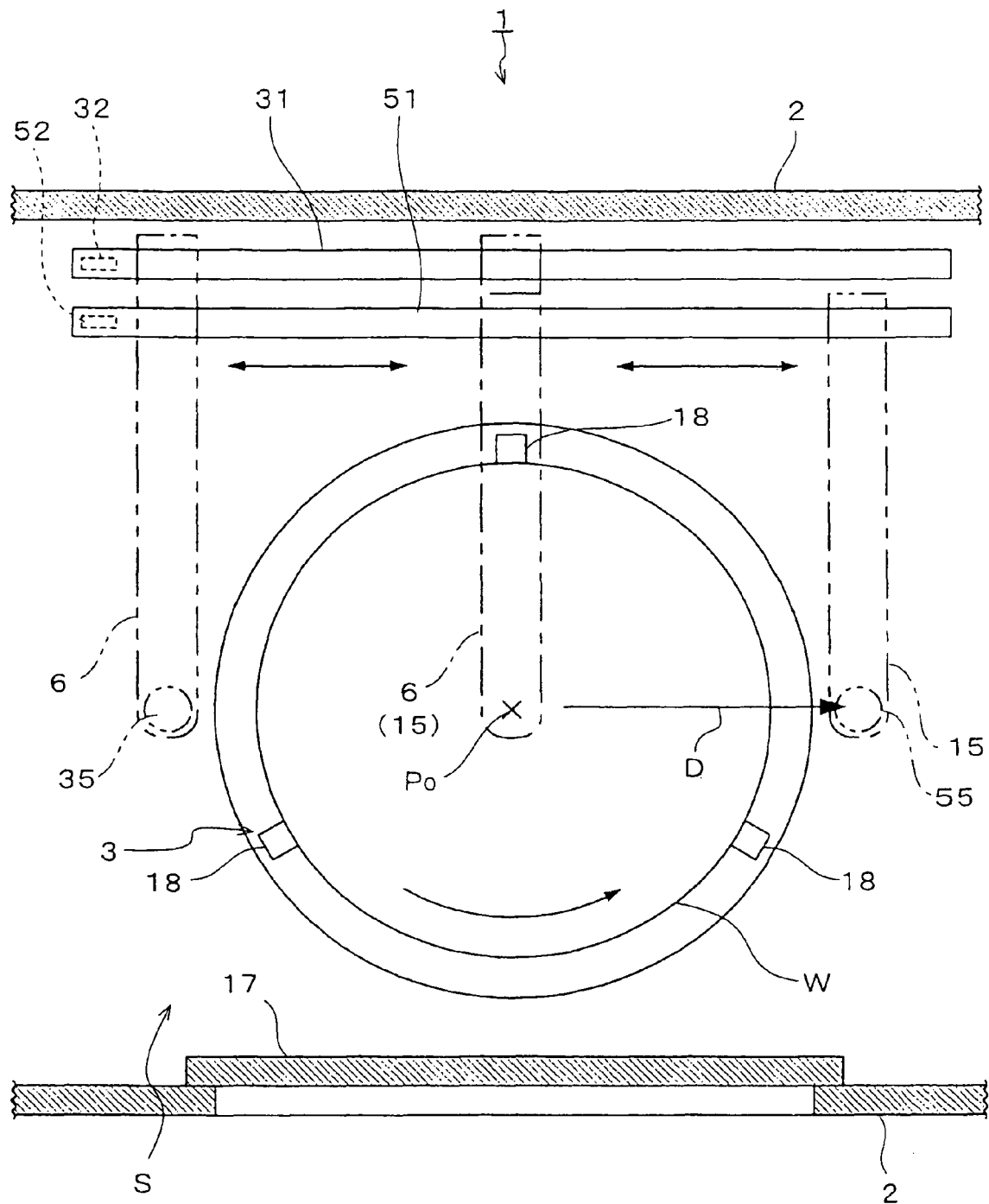
FIG. 2 is a horizontal cross-sectional view of a main part of the substrate processing apparatus shown in FIG. 1.

As shown in FIG. 2, a loading/unloading port 17 is disposed in the process vessel 2 through which the wafer W is loaded into an inside processing space S and is unloaded therefrom. By closing the loading/unloading port 17, it is possible to hermetically seal the processing space S.

As shown in FIGS. 1 and 2, three holding members 18 are disposed above the spin chuck 3. The holding members 18 are adapted to be in contact with a periphery of the wafer W at three points so as to substantially horizontally hold the wafer W. A motor 20 is disposed below the spin chuck 3 to rotate the same through a vertical rotational shaft. When the spin chuck 3 is rotated by the motor 20, the wafer W together with the spin chuck 3 is rotated in a horizontal plane about a center Po of the wafer W. Driving of the motor 20 is controlled by the controller 16.

The first support arm 6 is disposed above the wafer W supported by the spin chuck 3. A proximal end of the support arm 6 is supported to be capable of moving along a guide rail 31 which is substantially horizontally placed. A driving mechanism 32 is disposed for moving the support arm 6 along the guide rail 31. As shown in FIG. 2, along with a movement of the support arm 6 which is driven by the driving mechanism 32, the liquid nozzle 5 can radially move outside the wafer W relative to the rotational center Po of the wafer W. Driving of the driving mechanism 32 is controlled by the controller 16 (FIG. 1).

As shown in FIG. 1, the liquid nozzle 5 is attached to a lower end of an elevating shaft 36 extending downward from an elevating mechanism 35 fixed on a distal end of the support arm 6. The elevating shaft 36 is capable of vertically moving by the elevating mechanism 35, such that a position of the liquid nozzle 5 is set at a given height. Driving of the elevating mechanism 35 is controlled by the controller 16.

The liquid nozzle 5 is connected to a chemical liquid (DHF) supply source 41 through a chemical liquid supply channel 42, and is connected to a rinse liquid (DIW) supply source 43 through a rinse liquid supply channel 44. On-off valves 45 and 46 are disposed on the chemical liquid supply channel 42 and the rinse liquid supply channel 44, respectively. On-off actions of the on-off valves 45 and 46 are controlled by the controller 16. The liquid nozzle 5, the chemical liquid supply source 41, the chemical liquid supply channel 42, and the on-off valve 45 constitute a chemical liquid supply system. The liquid nozzle 5, the rinse liquid supply source 43, the rinse liquid supply channel 44, and the on-off valve 46 constitute a rinse liquid (process liquid) supply system.

The second support arm 15 is disposed above the wafer W supported by the spin chuck 3. A proximal end of the support arm 15 is supported to be capable of moving along a guide rail 51 which is substantially horizontally placed. A driving mechanism 52 is disposed for moving the support arm 15 along the guide rail 51. These members constitutes a nozzle moving mechanism that horizontally moves the fluid nozzle 12 and the drying gas nozzle 13. As shown in FIG. 2, along with the movement of the support arm 15 which is driven by the driving mechanism 52, the fluid nozzle 12 and the drying gas nozzle 13 can radially move outside the wafer W relative to the rotational center Po of the wafer W. Driving of the driving mechanism 52 is controlled by the controller 16 (FIG. 1).

As shown in FIG. 1, an elevating mechanism 55 provided with an elevating shaft 54 is fixed on a distal end of the second support arm 15. The elevating shaft 54 extends downward from the elevating mechanism 55. The fluid nozzle 12 and the drying gas nozzle 13 are attached to a lower end of the elevating shaft 54. The elevating shaft 54 is driven by the elevating mechanism 55 to expand and contract, so that the fluid nozzle 12 and the drying gas nozzle 13 are vertically moved together. Driving of the elevating mechanism 55 is controlled by the controller 16. That is, based on instructions from the controller 16, driving of the driving mechanism 52 is controlled so as to move the support arm 15, the fluid nozzle 12, and the drying gas nozzle 13 in the horizontal direction (nozzle moving direction D), while driving of the elevating mechanism 55 is controlled so as to adjust positions of the fluid nozzle 12 and the drying gas nozzle 13 in the vertical direction.

Figure 3:
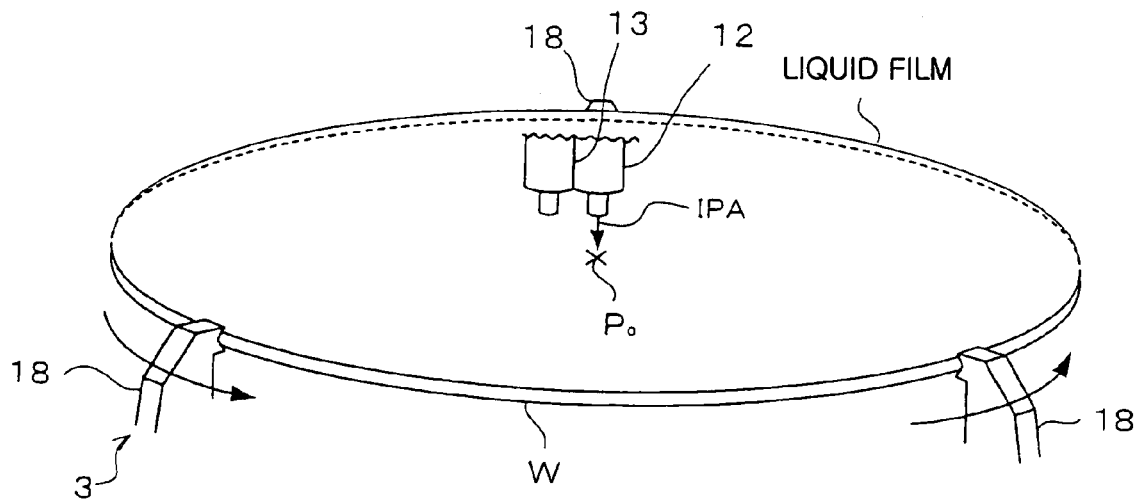
FIG. 3 is a perspective view of assistance in explaining an arrangement of a fluid nozzle at a liquid film forming step of the substrate processing apparatus shown in FIG. 1.
Figure 4:
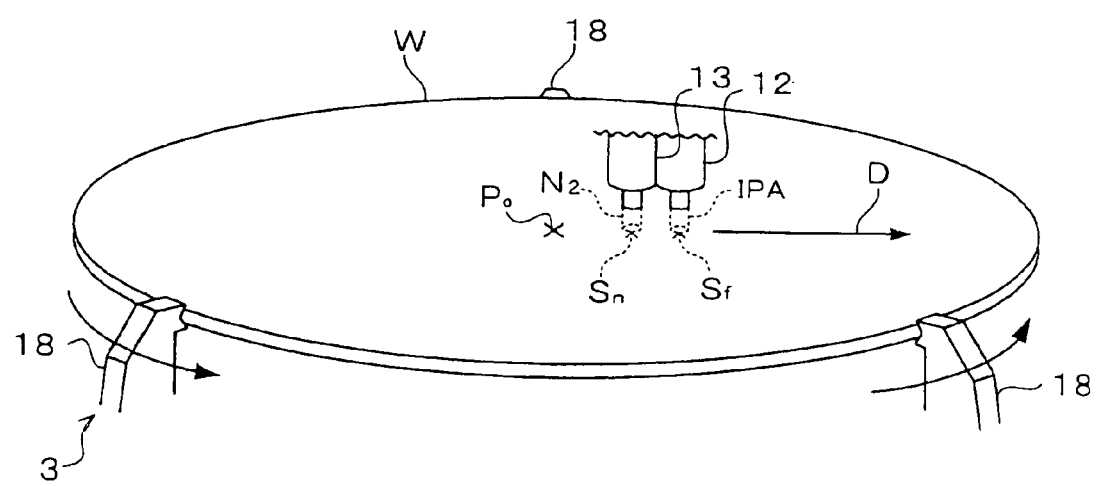
FIG. 4 is a perspective view of assistance in explaining actions of a fluid nozzle and a drying gas nozzle at a drying step of the substrate processing apparatus shown in FIG. 1.

As shown in FIGS. 3 and 4, the fluid nozzle 12 and the drying gas nozzle 13 are adjacently aligned in the radial direction (nozzle moving direction D) opposite the liquid nozzle 5 relative to the rotational center Po of the wafer W. That is, the drying gas nozzle 13 is positioned nearer to the rotational center Po of the wafer W than the fluid nozzle 12 in the nozzle moving direction D (strictly speaking, under conditions that a distance between a radial position of the fluid nozzle 12 and the rotational center Po is shorter than a distance between the nozzles 12 and 13 (see, FIG. 3), the positional relationship between the nozzles 12 and 13 is inverted).

The fluid nozzle 12 is connected through a fluid supply channel 67 to a fluid supply source 66, such as a tank, in which an IPA liquid is received. An on-off valve 68 is disposed on the fluid supply channel 67. An on-off action of the on-off valve 68 is controlled by the controller 16. The fluid nozzle 12, the fluid supply source 66, the fluid supply channel 67, and the on-off valve 68 constitute a fluid supply system.

The drying gas nozzle 13 is connected to an inert gas ($N_2$) supply source 71 through an inert gas supply channel 72. An on-off valve 73 is disposed on the inert gas supply channel 72. An on-off action of the on-off valve 73 is controlled by the controller 16. The gas nozzle 13, the gas supply source 71, the gas supply channel 72, and the on-off valve 73 constitute a drying gas supply system.

Respective functional elements in the substrate processing apparatus 1 are connected through signal lines to the controller 16 that automatically controls an overall operation of the substrate processing apparatus 1. The functional elements herein mean all the elements, such as the motor 20, the driving mechanism 32, the elevating mechanism 35, the driving mechanism 52, the elevating mechanism 55, and the on-off valves 45, 46, 68, and 73, that are operated to execute predetermined processes. The controller 16 is typically a multi-purpose computer capable of realizing a given function depending on a program to be executed.

As shown in FIG. 1, the controller 16 includes an operating part 16a provided with a CPU (central processing unit), an input/output part 16b connected to the operating part 16a, and a storage medium 16c storing a control program that is read out through the input/output part 16b. The storage medium 16c stores therein a control program to be executed by the controller 16 for executing steps of the below-described substrate processing method by the substrate processing apparatus 1. The controller 16 executes the control program to control the respective functional elements in the substrate processing apparatus 1, such that various processing conditions (for example, a rotational speed of the motor 20) defined by a predetermined processing recipe are achieved. In the substrate processing method based on the control program, a chemical process step, a rinsing step, a liquid film forming step, and a drying step are sequentially executed, which will be described in detail below.

The storage medium 16c may be fixedly disposed on the controller 16. Alternatively, the storage medium 16c may be removably disposed on a reader, not shown, mounted on the controller 16, and may be readable by the reader. In the most typical case, the storage medium 16c is a hard disk drive in which a control program has been installed by an operator of a manufacturing company of the substrate processing apparatus 1. In another case, the storage medium 16c is a removable disk such as CD-ROM or DVD-ROM in which a control program is written. Such a removable disk is read by a not-shown optical reader mounted on the controller 16. The storage medium 16c may either be a RAM (random access memory) type or a ROM (read only memory) type. Alternatively, the storage medium 16c may be a cassette type ROM. In short, any medium known in the technical field of a computer can be employed as the storage medium 16c. In a factory where the plurality of substrate processing apparatuses 1 are placed, the control program may be stored in an executive computer that comprehensively controls the controller 16 in each substrate processing apparatus 1. In this case, the respective substrate processing apparatuses 1 are operated by the executive controller via communication lines so as to execute predetermined processes.

Now, a method for processing a wafer W carried out by the substrate processing apparatus 1 as structured above is described.

First, a wafer W, which has not been cleaned yet, is loaded into the process vessel 2 by a transfer arm, not shown, and the wafer W is held by the spin chuck 3 as shown in FIG. 1. In order to deliver the wafer W to the spin chuck 3, as indicated by the two-dot chain lines shown in FIG. 2, the first and the second support arms 6 and 15 are previously retracted to standby positions located outside the spin chuck 3.

After the wafer W is held by the spin chuck 3, the spin chuck 3 is driven in rotation by the motor 20 shown in FIG. 1 to start a rotation of the wafer W. Then, the chemical process step is started. First, as indicated by the chain lines shown in FIG. 2, the first support arm 6 is moved such that the liquid nozzle 5 is positioned above the rotational center Po of the wafer W. Then, a chemical liquid is supplied from the liquid nozzle 5 toward the rotational center Po of the wafer W. The chemical liquid supplied to the rotational center Po is dispersed over the whole upper surface of the wafer W due to the centrifugal force. Thus, a liquid film of the chemical liquid is formed on the upper surface of the wafer W. A rotational speed of the wafer W while the chemical liquid is supplied thereto is set at about 500 rpm. After the liquid film of the chemical liquid is formed, the supply of the chemical liquid from the liquid nozzle 5 is stopped. Thereafter, by leaving the wafer W as it is for a predetermined period of time, the upper surface of the wafer W is processed by the liquid film of the chemical liquid. A hydrophobic property of the upper surface of the wafer W is increased by this chemical process.

Upon completion of the chemical process, the rinsing step is performed. In the rinsing step, a deionized water is supplied toward the rotational center Po of the rotating wafer W from the liquid nozzle 5. The thus supplied deionized water is dispersed over the whole upper surface of the wafer W due to the centrifugal force. The chemical liquid adhered to the upper surface of the wafer W is rinsed away from the wafer W by the deionized water. A rotational speed of the wafer W during the rinsing process is preferably faster than that of the wafer W while the chemical liquid is supplied thereto, and is set at about 1000 rpm, for example. After the wafer W is sufficiently rinsed by the deionized water, the supply of the deionized water from the liquid nozzle 5 is stopped. Thereafter, the support arm 6 positioned above the wafer W is retracted therefrom to be returned to the standby position.

Following the rinsing step, a liquid film forming step is carried out for forming a liquid film of an IPA liquid on the wafer W. First, as indicated by the chain lines shown in FIG. 2, the second support arm 15 is moved such that the fluid nozzle 12 is positioned above the rotational center Po of the wafer W. Then, as shown in FIG. 3, an IPA liquid (first fluid) is supplied from the fluid nozzle 12 toward the rotational center Po of the wafer W that is rotated at a predetermined rotational speed. The thus supplied IPA liquid is dispersed over the whole upper surface of the wafer W due to the centrifugal force, and a liquid film of the IPA liquid is formed on the whole upper surface of the wafer W. Formation of the liquid film can ensure that the deionized water adhered to the wafer W is brought in and mixed with the IPA liquid on the whole upper surface of the wafer W. In addition, the upper surface of the wafer W can be prevented from drying. A rotational speed of the wafer W during the liquid film forming step is preferably slower than that of the wafer W during the rinsing process, and is set at about 300 rpm, for example.

After the liquid film of the IPA liquid is formed on the upper surface of the wafer W, a drying step for drying the wafer W is performed by supplying an IPA liquid (second fluid) and nitrogen gas (drying gas) to the wafer W. First, a supply of an IPA liquid from the fluid nozzle 12 and then a supply of nitrogen gas from the drying gas nozzle 13 are started, with the fluid nozzle 12 and the drying gas nozzle 13 being positioned near above the rotational center Po of the wafer W. Then, as shown in FIG. 4, the second support arm 15 is moved in the nozzle moving direction D, while continuing to supply the IPA liquid and the nitrogen gas from the nozzles 12 and 13 to the upper surface of the rotating wafer W. Thus, as shown in FIG. 4, a supply position Sf of the IPA liquid supplied from the fluid nozzle 12 to the upper surface of the wafer, and a supply position Sn of the nitrogen gas supplied from the drying gas nozzle 13 to the upper surface of the wafer, are moved radially outward from the rotational center Po of the wafer W. Since the wafer W is rotated, the IPA liquid and the nitrogen gas can be supplied over the whole upper surface of the wafer W.

The supply of the IPA liquid and the supply of the nitrogen gas may be simultaneously started. For example, by starting the supply of the IPA liquid and the nitrogen gas when the fluid nozzle 12 is moved to a position directly above the rotational center Po of the wafer W, the supply of the IPA liquid may be started from the rotational center Po of the wafer W, and the supply of the nitrogen gas may be started from a position slightly behind away from the rotational center Po in the nozzle moving direction D. Alternatively, the supply of the nitrogen gas may be started, after starting the supply of the IPA liquid, when the drying gas nozzle 13 is moved to a position directly above the rotational center Po of the wafer W, whereby the supply of the nitrogen gas is started from the rotational center Po of the wafer W. Alternatively, the supply of the IPA liquid and the supply of the nitrogen gas may be started at positions slightly behind away from the rotational center Po in the nozzle moving direction D.

The IPA liquid supplied on the upper surface of the rotating wafer W flows radially outward on the wafer W due to the centrifugal force. While the supply position Sf of the IPA liquid is moved in the nozzle moving direction D, the supply position Sn of the drying gas is maintained nearer to the rotational center Po of the wafer W than the adjacent supply position Sf. In this case, the supply position Sn of the nitrogen gas is positioned between the rotational center Po and the supply position Sf. Thus, the IPA liquid supplied onto the upper surface of the wafer W is immediately washed away by the nitrogen gas, so that drying of the wafer W can be expedited. Accordingly, the wafer W can be efficiently dried with a less amount of IPA liquid, i.e., an amount of IPA liquid to be used can be restrained. Further, since an oxidation density causing water marks can be suppressed, the generation of water marks can be avoided.

A rotational speed of the wafer W at the drying step is between about 500 rpm and 800 rpm, for example. A moving speed of the supply position Sf of the IPA liquid and the supply position Sn of the nitrogen gas in the moving direction D is, e.g., about 150 mm/sec. Alternatively, a rotational speed of the wafer W may be varied in accordance with radial locations of the supply positions Sf and Sn on the wafer W. For example, when the supply positions Sf and Sn reside radially inward in the wafer W, the rotational speed of the wafer W may be increased. Meanwhile, when the supply positions Sf and Sn reside radially outward in the wafer W, the rotational speed of the wafer W may be lowered. To give an actual example, in drying the wafer W with a diameter of about 300 mm, the wafer W may be driven at a rotational speed of 800 rpm when the supply positions Sf and Sn are located within a radius of about 90 mm from the rotational center Po of the wafer W. Meanwhile, the wafer W may be driven at a rotational speed of 500 rpm, when the supply positions Sf and Sn are located outside the above range.

Alternatively, a moving speed of the supply positions Sf and Sn in the nozzle moving direction D may be varied in accordance with radial locations of the supply positions Sf and Sn on the wafer W. For example, when the supply positions Sf and Sn reside radially inward in the wafer W, the moving speed thereof may be increased. Meanwhile, when the supply positions Sf and Sn reside radially outward in the wafer W, the moving speed thereof may be lowered. To give an actual example, in drying the wafer W with a diameter of about 300 mm, the supply positions Sf and Sn may be moved at a moving speed of about 7 mm/sec, when the supply positions Sf and Sn are located within a radius of about 90 mm from the rotational center Po of the wafer W. Meanwhile, the supply positions Sf and Sn may be moved at a moving speed of about 3 mm/sec, when the supply positions Sf and Sn are outside the above range.

When the supply position Sf of the IPA liquid reaches a position on a periphery of the wafer W, the supply of the IPA liquid from the fluid nozzle 12 is stopped. Similarly, when the supply position Sn of the nitrogen gas reaches a position on the periphery of the wafer W, the supply of the nitrogen gas from the drying gas nozzle 13 is stopped. Then, the drying step is completed. It is possible to temporarily stay the supply position Sn of the nitrogen gas at a position on the periphery of the wafer W to continue for a while the supply of the nitrogen gas onto the periphery, and then stop the supply of the nitrogen gas. In this case, the wafer can be more reliably dried.

After the drying step is finished, the rotation of the spin chuck 3 is stopped, and the not-shown transfer arm is allowed to enter the process vessel 2. The wafer W is delivered from the spin chuck 3 to the transfer arm, and is then unloaded from the process vessel 2. In this manner, a series of processes for the wafer W performed by the substrate processing apparatus 1 are finished.

As described above, according to this embodiment, after the deionized water is supplied, a liquid film of the IPA liquid (first fluid) is formed on the upper surface of the wafer W. Thus, the deionized water adhered to the upper surface of the wafer W can be surely brought in and mixed with the IPA liquid. In addition, since the liquid film covering the wafer W prevents a natural drying of the upper surface of the wafer W, in particular, a periphery thereof, the generation of particles on the upper surface of the wafer W can be prevented. Even when the upper surface of the wafer W is highly hydrophobic, the generation of particles can be efficiently prevented.

After the liquid film of the IPA liquid is formed, the IPA liquid (second fluid) is supplied to the wafer W, while the supply position Sf is moved radially outward from the rotational center Po, i.e., in the moving direction D. Thus, the liquid film of the IPA liquid (first fluid) taking therein and being mixed with the deionized water can be flushed away and removed from the wafer W. As a result, the upper surface of the wafer W can be uniformly, efficiently dried. In addition, nitrogen gas for drying the wafer W is supplied at the supply position Sn, which is behind the supply position Sf of the IPA liquid in the moving direction D, so that the liquid (mainly the IPA liquid) remaining on the wafer W is washed out toward the periphery of the wafer W. Thus, drying of the wafer W can be promoted. Accordingly, an amount of the IPA liquid (second fluid) used for drying the wafer W can be relatively reduced. Besides, the generation of particles caused by a difference between a volatile property of IPA and that of a deionized water can be prevented to thereby enhance a quality of the wafer W.

Although the preferred embodiment of the present invention has been described, the present invention is not limited to the above embodiment. For example, not limited to a semiconductor wafer, a substrate may be a glass substrate for an LCD, a CD substrate, a print substrate, a ceramic substrate, and so on.

The method has been described in which the wafer W is subjected to the chemical process step, the rinsing step, the liquid film forming step, and the drying step. However, the present invention is not limited thereto, and can be applied to various other processes. Besides, a chemical liquid used in the chemical process step is not limited to a liquid for cleaning the wafer W. For example, the chemical process step may be an etching step in which the wafer W is etched by supplying thereto an etching chemical liquid, such as HF (hydrogen fluoride). Alternatively, the chemical process step may be a step for removing a resist, and a step for removing etching residues. Moreover, the wafer W may subjected to, for example, a scrubbing process in which the wafer W is rubbed by a scriber such as a brush and a sponge, and subsequently subjected to the rinsing step, liquid film forming step, and drying step. Although a deionized water as a rinse liquid is given as an example of a process liquid, the process liquid is not limited thereto.

In the above embodiment, the chemical liquid and the rinse liquid (process liquid) are supplied from the same liquid nozzle 5. However, these liquids may naturally be supplied from separate nozzles. In this case, a nozzle for supplying the chemical liquid and a nozzle for supplying the rinse liquid may be respectively supported by separate arms. Alternatively, the nozzle for supplying the rinse liquid may be supported by the support arm 15 that supports the fluid nozzle 12 and the drying gas nozzle 13.

Given herein as an example to describe the liquid film forming step is a case in which the IPA liquid (first fluid) is supplied onto the rotational center Po of the wafer W, and a liquid film is formed by utilizing the centrifugal force caused by the rotation of the wafer W. However, a method for forming a liquid film is not limited thereto. For example, the supply position of the IPA liquid may be moved above the wafer W between the rotational center Po and the periphery of the wafer W, while rotating the wafer W. In this case as well, a liquid film can be suitably formed. In this method, the supply position of the IPA liquid may either be radially moved only once in an outward or inward direction relative to the rotational center Po, or be radially reciprocated once or more relative to the rotational center Po. A moving speed of a supply position of the IPA liquid (first fluid) at the liquid film forming step is preferably faster than that of the supply position Sf of the IPA liquid (second fluid) at the drying step. This enables that a liquid film is formed more rapidly. At the liquid film forming step, a moving speed of the supply position of the IPA liquid is, e.g., about 150 mm/sec, and a rotational speed of the wafer W is e.g., about 300 rpm. The rotational speed of the wafer W at the liquid film forming step is preferably slower than that of the wafer W at the drying step. This enables a reliable formation of a liquid film, without the centrifugal force discouraging the liquid film formation. On the other hand, since the wafer W is rotated at relatively a higher speed, the wafer W can be promptly dried.

The first and second fluids, that have a volatile property higher than the rinse liquid (process liquid), are not limited to an IPA liquid. Instead of the IPA liquid, an IPA solution containing IPA diluted by a deionized water or the like may be used as at least one of the first and second fluids (hereinafter referred to as "drying fluid"). In this case, an amount of the drying fluid to be used can be reduced, which results in decrease in cost. In addition to a liquid state, the drying fluid may take an atomized state, a jet-flow state, and a gaseous state. For example, a mist of IPA liquid, a mist of IPA solution, an IPA vapor, or a vapor of IPA solution (mixed vapor in which IPA vapor and water vapor are mixed) may be used as the drying fluid. Besides, a mixture of the mist or vapor and a gas such as nitrogen gas may be used as the drying fluid. Moreover, an organic solvent containing an organic compound such as HFE (hydrofluoro ether) and acetone, and a liquid containing a surface-active agent may be used as the drying fluid. In this case, any state, such as an atomized state, a jet-flow state, and a vapor state, will do. Also in the case where these fluids are used as the second fluid, drying of the wafer W can be accelerated by simultaneously supplying a drying gas such as nitrogen gas. Thus, an amount of the second fluid to be used can be decreased, so that a reduction in cost can be achieved.

Alternatively, the first fluid and the second fluid may not be identical to each other. For example, a density of IPA in an IPA solution used as the first fluid and a density of IPA in an IPA solution used as the second fluid may be different from each other. Alternatively, states (phases) of the first fluid and the second fluid may be different from each other. For example, it is possible to use a liquid such as an IPA liquid as the first fluid, and to use a gas such as an IPA vapor or a mist of IPA liquid as the second fluid.

In the above embodiment, although the first fluid and the second fluid are supplied from the single fluid nozzle 12, the first fluid and the second fluid may be supplied from separate nozzles. For example, a first nozzle for supplying the first fluid and a second fluid nozzle for supplying the second fluid may be supported by the support arm 15 so as to move the first fluid nozzle, the second fluid nozzle, and the drying gas nozzle 13 all together.

A two-fluid nozzle may be used as a nozzle for supplying the drying fluid. For example, an IPA liquid or IPA solution is formed inside the two-fluid nozzle into a jet-flow of a number of particulate droplets by mixing a liquid, such as an IPA liquid or IPA solution, and a gas, such as nitrogen gas. The droplets are accelerated by the gas and jetted from the two-fluid nozzle. A structure of the two-fluid nozzle is not limited to an internal mixing type, but may be a structure of an external mixing type in which a liquid and a gas are mixed outside.

Figure 5:
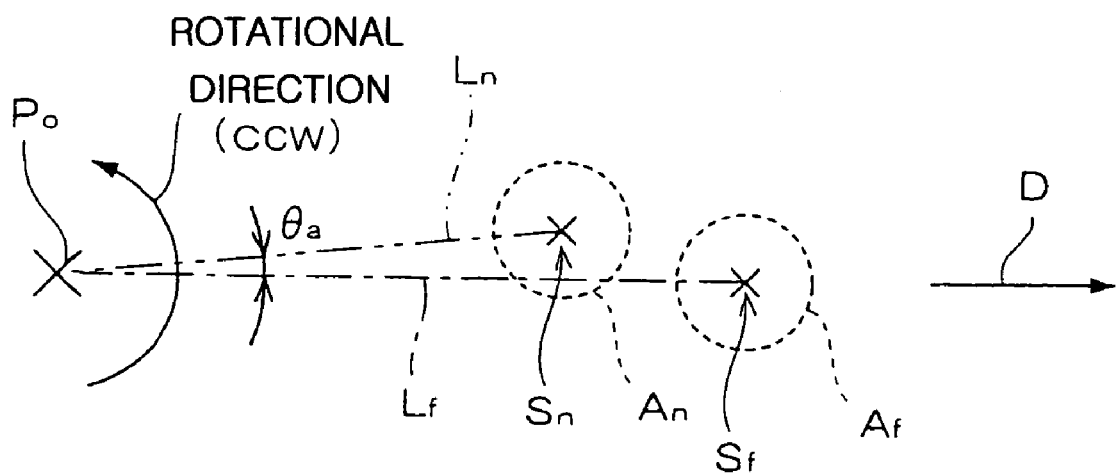
FIG. 5 is a plan view of assistance in explaining an arrangement of a fluid nozzle and a drying gas nozzle of another embodiment of the substrate processing apparatus according to the present invention.

Another embodiment of the substrate processing apparatus shown in FIG. 5 is described below. In this embodiment, a supply position Sn of nitrogen gas (drying gas nozzle 13) to a wafer W is positioned ahead of a supply position Sf of an IPA liquid (second fluid) (fluid nozzle 12) to the wafer W, in a rotational direction (CCW) of the wafer W. In FIG. 5, a supply area of the IPA liquid from the nozzle 12 is depicted by a circle Af indicated by the broken line, and a supply area of the nitrogen gas from the nozzle 13 is depicted by a circle An indicated by the broken line. A center point of the supply area Af is represented by the supply position Sf, and a center point of the supply area An is represented by the supply position Sn. A line Lf connects the supply position Sf and the rotational center Po of the wafer W to each other. A line Ln connects the supply position Sn and the rotational center Po of the wafer W to each other. In this case, the line Ln is displaced from the line Lf at an angle θn which is smaller than 90° in the rotational direction of the wafer W. Thus, the nitrogen gas (drying gas) following the IPA liquid (second fluid) can be constantly supplied to the wafer W not only in the radial direction but also in the rotational direction of the wafer W. Therefore, the wafer W can be rapidly dried by flushing away the IPA liquid on the wafer W away by the drying gas.

Figure 6:
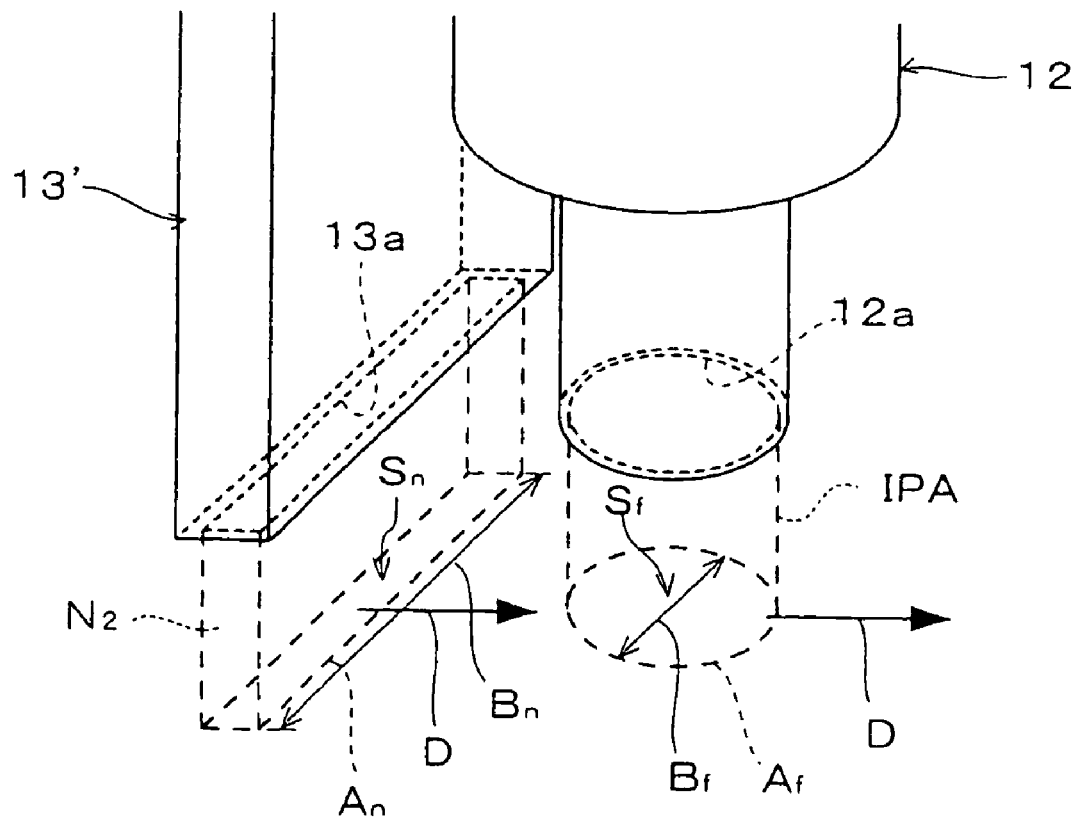
FIG. 6 is a perspective view of assistance in explaining opening dimensions (shapes) of a fluid nozzle and an inert-gas nozzle of another embodiment of the substrate processing apparatus according to the present invention.

Another embodiment of the substrate processing apparatus shown in FIG. 6 is described below. In this embodiment, opening dimension Bn of a drying gas nozzle 13 is larger than opening dimension Bf of a fluid nozzle 12, in a direction perpendicular to a nozzle moving direction D (herein, the direction is in parallel to a surface of a wafer W). To be specific, the fluid nozzle 12 has a circular opening 12a, while the drying gas nozzle 13 has a rectangular opening 13a whose long side is longer than a diameter of the circular opening 12a. Thus, dimension of a supply area An of the drying gas is larger than dimension of a supply area Af of a second fluid (IPA liquid, for example), in the direction perpendicular to the nozzle moving direction D. This design enables that nitrogen gas can be sufficiently supplied at a position behind the supply position Sf in the moving direction D, so that the IPA liquid can be efficiently washed away by the nitrogen gas. Therefore, the wafer W can be efficiently, reliably dried.

Not limited to nitrogen gas, a drying gas used at the drying step may be another inert gas. The drying gas is not limited to an inert gas, but may be air or the like. Also in this case, the second fluid (e.g., IPA liquid) which has been supplied on an upper surface of the wafer W can be flushed away, and drying of the wafer W can be promoted. In addition, the drying gas may be a gas, such as a dry air or the like, with its humidity being forcibly lowered as compared with a general state of the gas. In this case, a humidity near the upper surface of the wafer W can be reduced to facilitate evaporation of a liquid, such as the IPA liquid, adhered to the wafer W, whereby drying of the wafer W can be more expedited. An absolute humidity of the drying gas is not more than 1 $g/m^3$, for example.

Next, another embodiment of the substrate processing apparatus shown in FIG. 7 is described below. In this embodiment, there are further provided a fluid heater 67a that heats a second fluid (IPA liquid or the like) to be supplied from a fluid nozzle 12, and a drying gas heater 72a that heats a drying gas to be supplied from a drying gas nozzle 13. The fluid heater 67a is disposed on a fluid supply channel 67, and is controlled by a controller 16. The drying gas heater 72a is disposed on an inert gas supply channel 72, and is controlled by the controller 16. The fluid heater 67a may be disposed on a tank of a fluid supply source 66.

To supply from the fluid nozzle 12 a second fluid forcibly heated by the fluid heater 67a at a temperature higher than a normal temperature promotes evaporation of the first fluid and the second fluid that have been supplied to the wafer W, whereby the wafer W can be more efficiently dried. Similarly, to supply from the drying gas nozzle 13 a drying gas forcibly heated at a temperature higher than a normal temperature promotes evaporation of the first fluid and the second fluid that have been supplied to the wafer W, whereby the wafer W can be more efficiently dried.

Figure 8:
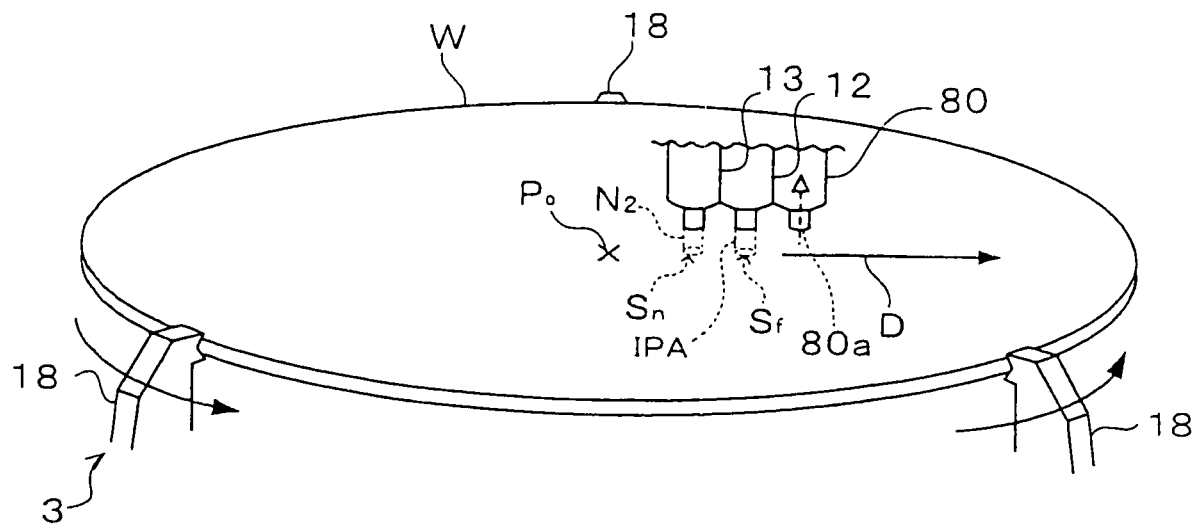
FIG. 8 is a perspective view of assistance in explaining actions of a suction nozzle, a fluid nozzle, and a drying gas nozzle, of another embodiment of the substrate processing apparatus according to the present invention.

Another embodiment of the substrate processing apparatus shown in FIG. 8 is described below. In this embodiment, there is further provided a suction nozzle 80 that sucks an atmosphere near an upper surface of a wafer W. To be specific, the suction nozzle 80 provided with a suction opening 80a is disposed on a support arm 15 such that the suction nozzle 80 is moved together with a fluid nozzle 12 and a drying gas nozzle 13. In this case, while a supply position Sf (fluid nozzle 12) of a second fluid is moved in a nozzle moving direction D, the suction opening 80a of the suction nozzle 80 is maintained farther away from a rotational center Po of the wafer W than the adjacent supply position Sf of an IPA liquid. A suction apparatus such as a pump, not shown, is connected the suction nozzle 80. An actuation of the suction apparatus is controlled by a controller 16, and a suction action by the suction nozzle 80 is controlled.

Due to this structure, at the drying step, moisture contained in an atmosphere near the supply position Sf can be sucked by the suction nozzle 80, while the second fluid (IPA liquid or the like) is supplied from the fluid nozzle 12 which is moved in the moving direction D. Thus, it can be prevented that moisture in the processing space S is dissolved in the second fluid supplied onto the supply position Sf on the wafer W. Therefore, the wafer W can be favorably dried. In particular, by sucking an atmosphere at a position ahead of the supply position Sf of the second fluid in the moving direction D, an more improved effect can be obtained.

Figure 9:
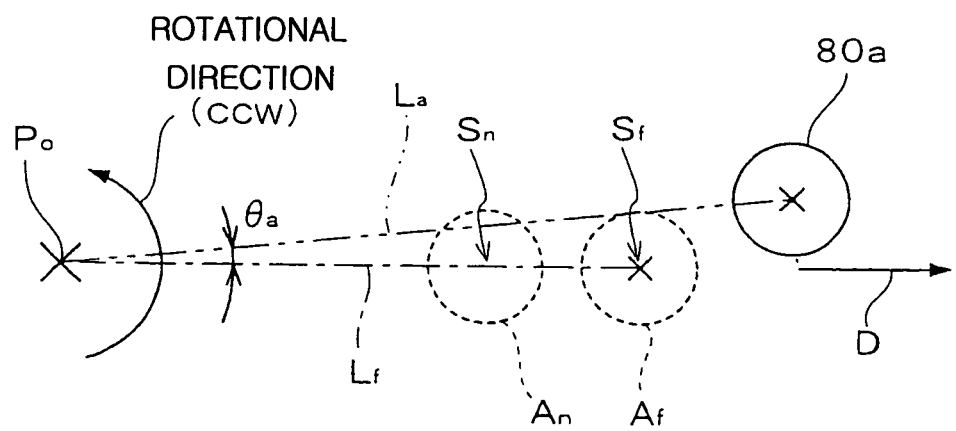
FIG. 9 is a plan view of assistance in explaining an arrangement of a suction nozzle, a fluid nozzle, and a drying gas nozzle, of another embodiment of the substrate processing apparatus according to the present invention.

Another embodiment of the substrate processing apparatus shown in FIG. 9 is described below. In this embodiment, a center point of the suction opening 80a of the suction nozzle 80 relative to the wafer W in the embodiment shown in FIG. 8 is positioned ahead of a supply position Sf (fluid nozzle 12) of a second fluid (IPA liquid or the like) to the wafer W, in a rotational direction (CCW) of the wafer W. In FIG. 9, similar to FIG. 5, a supply area of the second fluid from the nozzle 12 is depicted by a circle Af indicated by the broken line, and a supply area of a drying gas from a nozzle 13 is depicted by a circle An indicated by the broken line. A center point of the supply area Af is represented by a supply position Sf, and a center point of the supply area An is represented by a supply position Sn. A line Lf connects the supply position Sf of the second fluid and a rotational center Po of the wafer W to each other. A line La connects the supply position Sn and the rotational center Po of the wafer W to each other. In this case, the line La is displaced from the line Lf at an angle Oa which is smaller than 90° in the rotational direction of the wafer W. Thus, the preceding suction opening 80a can suck an atmosphere above the wafer W, just before the second fluid is supplied to an upper surface of the wafer W from the fluid nozzle 12. Therefore, it can be effectively prevented that moisture in a processing space S is dissolve in the IPA liquid supplied to the wafer W.

In this embodiment, the fluid nozzle 12 and the drying gas nozzle 13 are supported by a sole support arm 15, such that the fluid nozzle 12 and the drying gas nozzle 13 are moved together with the support arm 15. However, the fluid nozzle 12 and the drying gas nozzle 13 may be supported by separate support arms.

In this embodiment, while the second fluid is supplied to the wafer W, the fluid nozzle 12 and the drying gas nozzle 13 are moved in the same direction relative to the wafer W, i.e., in the moving direction D. However, the fluid nozzle 12 and the drying gas nozzle 13 may be moved in different directions.

Figure 10:
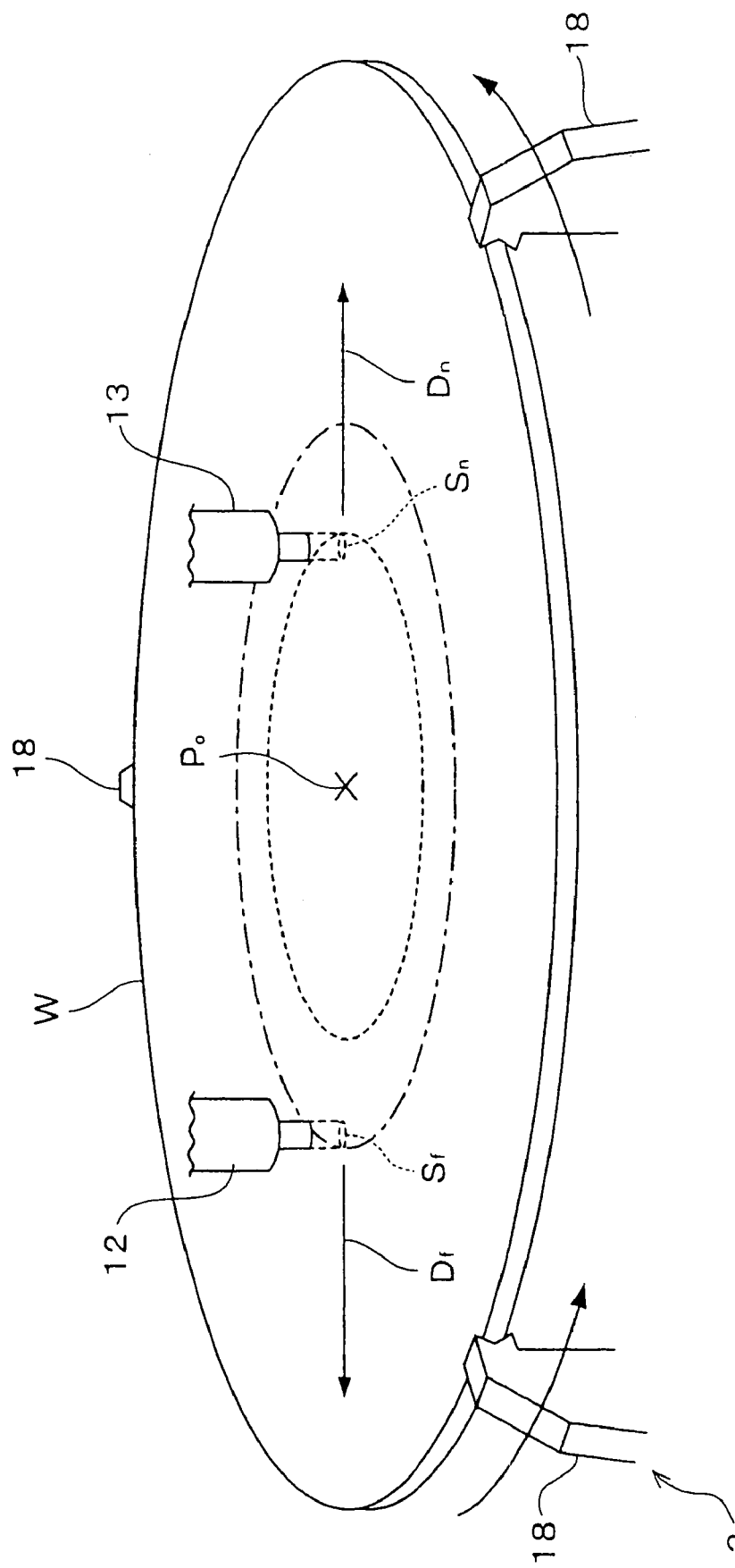
FIG. 10 is a perspective view of assistance in explaining actions of a fluid nozzle and a drying gas nozzle at a drying step of another embodiment of the substrate processing apparatus according to the present invention.

Another embodiment of the substrate processing apparatus shown in FIG. 10 is described below. In this embodiment, a fluid nozzle 12 and a drying gas nozzle 13 are respectively supported by separate support arms, which structure is different from the embodiment shown in FIGS. 1 to 4. In this embodiment, the fluid nozzle 12 and the drying gas nozzle 13 are radially moved in different directions. To be specific, there are separately disposed a support arm that supports the fluid nozzle 12 and a support arm that supports the drying gas nozzle 13. At the drying step, the respective support arms are radially moved in different directions at an angle of 180° by a control of a controller 16 (FIG. 1). Thus, the fluid nozzle 12 and the drying gas nozzle 13 are moved radially outward in different directions at an angle of 180° from a rotational center Po of the wafer W. Also in this case, a supply position Sn of a drying gas is maintained at a position nearer to the rotational center Po of the wafer W than a supply position Sf of a second fluid. That is, a distance between the supply position Sn of a drying gas and the rotational center Po is controlled to be constantly shorter than a distance between the supply position Sf of a second fluid and the rotational center Po. Also in this case, with a rotation of the wafer W to move the second fluid which has been supplied at the supply position Sf in an upper surface of the wafer W toward the supply position Sn of a drying gas, the second fluid is blown off toward an outer periphery of the wafer W by the drying gas supplied from the side of the rotational center Po, so that the wafer is dried. Therefore the wafer W can be efficiently dried.

In a case where the fluid nozzle 12 is divided into a first fluid nozzle and a second fluid nozzle as described above, and a case where the suction nozzle 80 shown in FIG. 8 is provided, these nozzles may be optionally supported by separate arms. Alternatively, these nozzles may be optionally moved in different directions.

Figure 11:
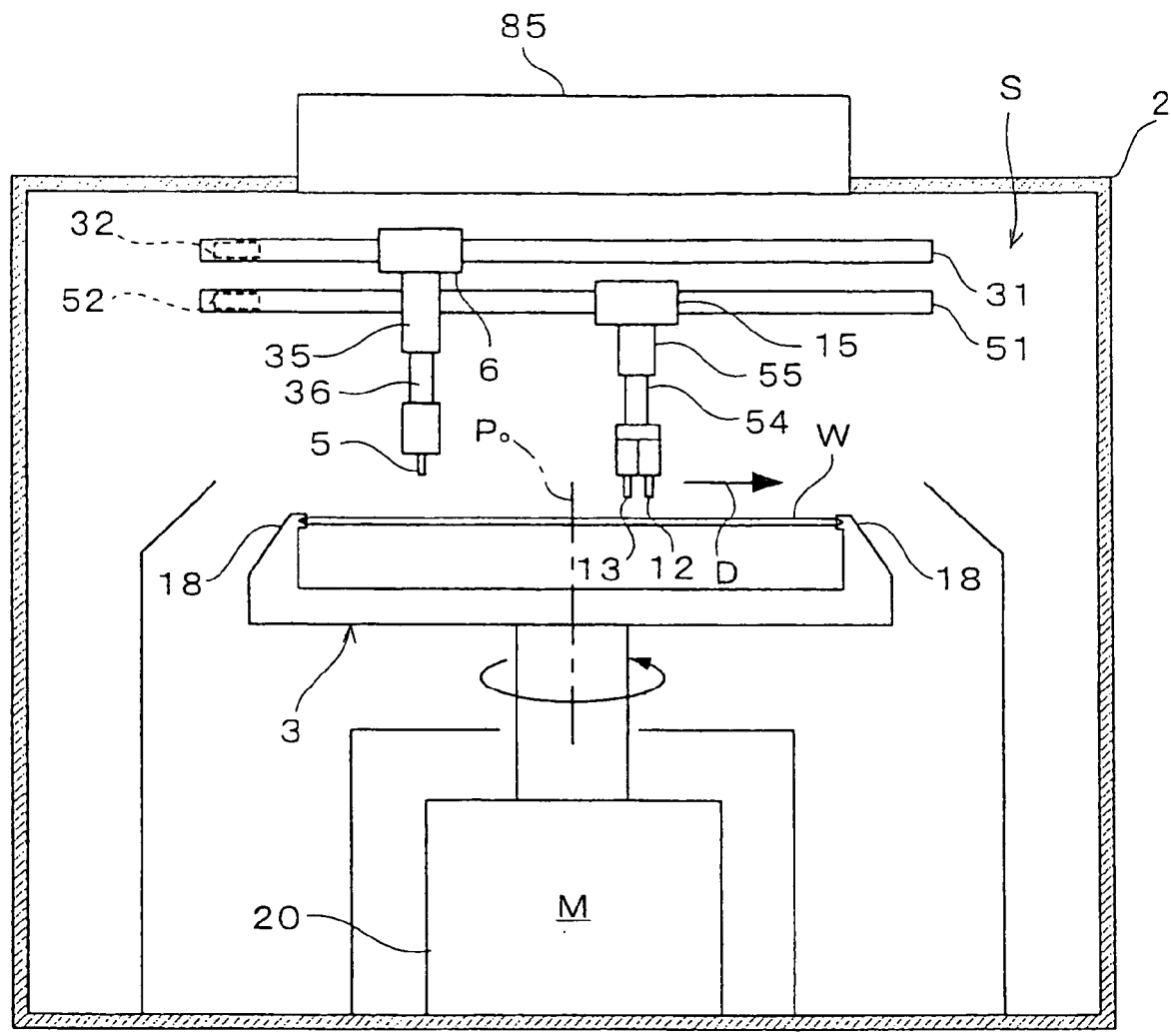
FIG. 11 is a schematic view of another embodiment of the substrate processing apparatus according to the present invention, that is provided with a moisture adjusting system.

Another embodiment of the substrate processing apparatus shown in FIG. 11 is described below. In this embodiment, a humidity adjustor 85 is disposed on a ceiling of a process vessel 2 as a humidity adjusting system that adjusts a humidity around a wafer W held by a spin chuck 3. The humidity adjustor 85 can adjust a humidity in an overall processing space S in the process vessel 2. When carrying out at least one of the liquid film forming step and the drying step, the humidity in the process vessel 2 is lowered as compared with the humidity at the chemical process step and the rinsing step. In this case, it can be prevented that moisture contained in the processing space S is dissolved in at least one of the first and second fluids supplied to the wafer W. Thus, the generation of particles on the wafer W after it is dried can be prevented. In addition, drying of the wafer W can be expedited at the drying step.

Figure 12:
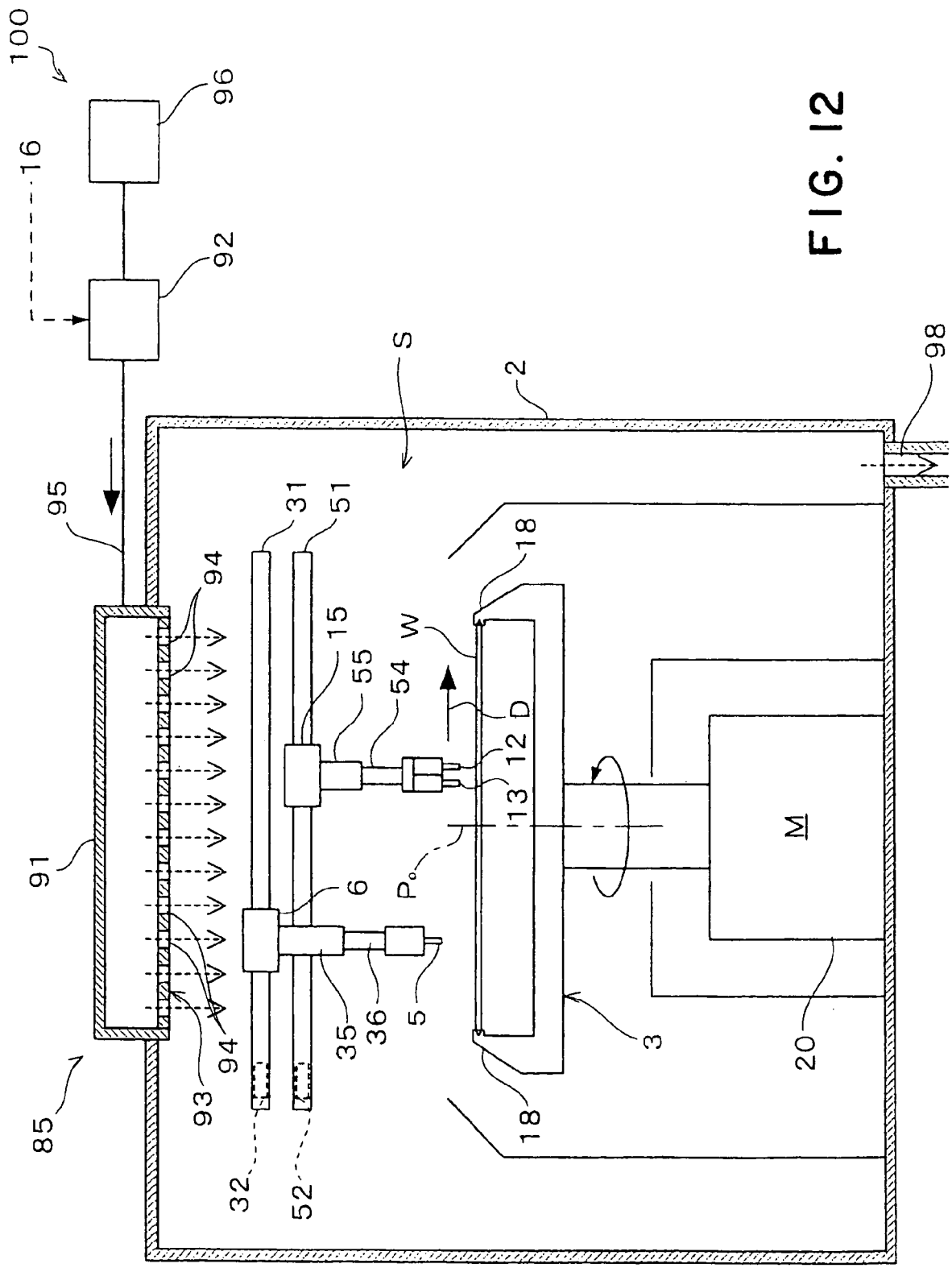
FIG. 12 is a schematic view of another embodiment of the substrate processing apparatus according to the present invention, that is provided with a moisture adjusting system.

Another embodiment of the substrate processing apparatus provided with a humidity adjusting system shown in FIG. 12 is described below. In this embodiment, the humidity adjusting system 100 is constituted such that a gas with an adjusted humidity is supplied into a processing space S in a process vessel 2 from above, and the gas is discharged from below.

To be specific, as shown in FIG. 12, the humidity adjusting system 100 in this embodiment includes a gas supply vessel 91 that supplies into the process vessel 2 an inert gas for adjusting a humidity. The gas supply vessel 91 is disposed on a ceiling of the process vessel 2. A baffle plate 93 having a plurality of gas supply ports 94 is disposed between the gas supply vessel 91 and the process vessel 2. The gas supply ports 94 are uniformly distributed in the overall baffle plate 93. The gas supply vessel 91 is connected to a gas supply source 96 through a gas inlet channel 95. A humidity adjusting mechanism 92 is disposed on the gas inlet channel 95 to adjust a humidity of an inert gas supplied from the gas supply source 96. The humidity adjusting mechanism 92 is controlled in accordance with a control instruction from a controller 16, and is capable of adjusting moisture contents contained in the inert gas to a given value. The inert gas supplied from the gas supply vessel 91 into the process vessel 2 downwardly flows into the process space S above the wafer W which is held by the spin chuck 3, and is discharged through an outlet port 98 formed in a bottom of the process vessel 2. Thus, a downflow of the inert gas with its humidity adjusted is formed in the processing space S, and thus the humidity in the processing space S can be suitably controlled.

A gas for adjusting a humidity supplied from the gas supply source 96 is not limited to an inert gas, and may be another gas such as an air. When air is used, the humidity in the processing space S can also be favorably controlled.

In general, a clean room in which a substrate processing apparatus is installed has a normal temperature (about 23° C.) and a relative humidity of about 40% to about 45%. The humidity in the processing space S may be decreased in comparison with the relative humidity of the clean room, at least at one of the liquid film forming step and the drying step. This can further enhances a drying performance of the wafer W. In this case, the humidity of the processing space S may be, e.g., about not more than 25% (relative humidity at a temperature of about 23° C.). Alternatively, the absolute humidity of the processing space S may be, e.g., about 5 g/m$^3$.

Adjustment of the humidity in the processing space S is carried out at least at only one of the film forming step and the drying step. However, not limited thereto, the humidity of the processing space S may be adjusted between the chemical process step and the rinsing step. Alternatively, the humidity of the processing space S may be constantly adjusted.

The invention claimed is:

1. A substrate processing method comprising the steps of:
    processing the substrate by a process liquid;
    then forming a liquid film, including a first fluid and the process liquid mixed with the first fluid, on a whole upper surface of the substrate by supplying thereon a first fluid having a higher volatility than that of the process liquid; and
    then supplying a second fluid, having a higher volatility than that of the process liquid, to the liquid film including the first fluid and the process liquid mixed with the first fluid, which is formed on the whole upper surface of the substrate, while rotating the substrate,
    wherein at the step of supplying the second fluid, a supply position of the second fluid to the substrate is moved radially outward relative to a rotational center of the substrate so as to flush away and remove the liquid film including the first fluid and the process liquid mixed with the first fluid from the substrate.

2. The substrate processing method according to claim 1, further comprising a chemical process step of processing the substrate by a chemical liquid, before the step of processing the substrate by the process liquid.

3. The substrate processing method according to claim 2, wherein a hydrophobic property of the upper surface of the substrate is increased by the chemical process step.

4. The substrate processing method according to claim 1, wherein at the step of forming the liquid film, while rotating the substrate, a supply position of the first fluid to the substrate is moved radially outward relative to the rotational center of the substrate to form the liquid film.

5. The substrate processing method according to claim 4, wherein a moving speed of the supply position of the first fluid at the step of forming the liquid film is faster than a moving speed of the supply position of the second fluid at the step of supplying the second fluid.

6. The substrate processing method according to claim 4, wherein a rotational speed of the substrate at the step of forming the liquid film is slower than a rotational speed of the substrate at the step of supplying the second fluid.

7. The substrate processing method according to claim 1, wherein at the step of supplying the second fluid, a drying gas is further supplied to the upper surface of the substrate, and supply positions of the drying gas and the second fluid to the substrate are moved radially outward relative to the rotational center of the wafer, respectively, while maintaining the supply position of the drying gas to the substrate nearer to the rotational center of the substrate than the supply position of the second fluid.

8. The substrate processing method according to claim 7, wherein the supply position of the drying gas to the substrate is positioned between the rotational center of the substrate and the supply position of the second fluid.

9. The substrate processing method according to claim 8, wherein the supply position of the drying gas to the substrate is positioned ahead of the supply position of the second fluid to the substrate, in a rotational direction of the substrate.

10. The substrate processing method according to claim 8, wherein dimension of a supply area of the drying gas to the substrate is larger than dimension of a supply area of the second fluid to the substrate, in a direction perpendicular to the moving direction of the supply positions.

11. The substrate processing method according to claim 7, wherein the drying gas is an inert gas.

12. The substrate processing method according to claim 7, wherein the drying gas is a dry air.

13. The substrate processing method according to claim 7, wherein a heated drying gas is supplied.

14. The substrate processing method according to claim 1, wherein the step of supplying the second fluid is performed, while sucking an atmosphere near the upper surface of the substrate.

15. The substrate processing method according to claim 14, wherein a suction position of the atmosphere and the supply position of the second fluid to the substrate are moved radially outward relative to the rotational center of the substrate, while maintaining the suction position of the atmosphere farther away from the rotational center of the substrate than the supply position of the second fluid.

16. The substrate processing method according to claim 14, wherein a suction position of the atmosphere is positioned ahead of the supply position of the second fluid to the substrate, in a rotational direction of the substrate.

17. The substrate processing method according to claim 1, wherein at least one of the steps of forming the liquid film and the step of supplying the second fluid is performed, with a humidity around the substrate being lower than that at the step of processing the substrate by the process liquid.

18. The substrate processing method according to claim 1, wherein the processing liquid is a deionized water.

19. The substrate processing method according to claim 1, wherein at least one of the first liquid and the second liquid is selected from the group consisting of an IPA liquid, an IPA solution, a mist of IPA liquid, an IPA vapor, and a vapor of IPA solution.

20. The substrate processing method according to claim 1, wherein the first liquid and the second liquid are identical to each other.

21. The substrate processing method according to claim 1, wherein a heated second fluid is supplied.

22. A substrate processing method comprising the steps of:
    processing the substrate by a process liquid;
    supplying onto the substrate a first fluid having a higher volatility than that of the process liquid until a liquid film, including a mixture of the first fluid and the process liquid, is formed on a whole upper surface of the substrate; and
    then supplying a second fluid, having a higher volatility than that of the process liquid, to the liquid film while rotating the substrate, wherein
    at the step of supplying the second fluid, a supply position of the second fluid to the substrate is moved radially outward relative to a rotational center of the substrate so as to remove the liquid film, and
    at the step of forming the liquid film, the substrate is rotated and a supply position of the first fluid to the substrate is moved radially outward relative to the rotational center of the substrate and then moved radially inward relative to the rotational center of the substrate.

23. The substrate processing method according to claim 22, wherein a moving speed of the supply position of the first fluid at the step of forming the liquid film is faster than a moving speed of the supply position of the second fluid at the step of supplying the second fluid.

24. The substrate processing method according to claim 23, wherein a rotational speed of the substrate at the step of forming the liquid film is slower than a rotational speed of the substrate at the step of supplying the second fluid.

25. The substrate processing method according to claim 24, wherein the rotational speed of the substrate at the step of forming the liquid film is slower than a rotational speed of the substrate at the step of processing the substrate by the process liquid.

26. A substrate processing method comprising the steps of:
processing the substrate by a process liquid;
while rotating the substrate, supplying onto the substrate a first fluid having a higher volatility than the process liquid until a liquid film that is a mixture of the first fluid and the processing liquid is formed on an entire upper surface of the substrate;
while rotating the substrate, supplying a second fluid, different from the first fluid, over the entire upper surface of the substrate, and
during supplying of the second fluid, moving a supply position of the second fluid radially outwardly relative to a rotational center of the substrate to remove the liquid film from the upper surface of the substrate.

27. A substrate processing method according to claim 26, wherein the first and the second fluids have different densities.

28. A substrate processing method according to claim 26, wherein the first and the second fluids are of different states.

* * * * *